United States Patent
Hirai et al.

(10) Patent No.: US 12,339,480 B2
(45) Date of Patent: Jun. 24, 2025

(54) COMPOSITION, OPTICALLY ANISOTROPIC FILM, CIRCULARLY POLARIZING PLATE, DISPLAY DEVICE, COMPOUND, AND METHOD FOR PRODUCING COMPOUND

(71) Applicant: FUJIFILM Corporation, Tokyo (JP)

(72) Inventors: Yuki Hirai, Kanagawa (JP); Ryoji Goto, Kanagawa (JP); Shinichi Morishima, Kanagawa (JP); Takahiro Ichikawa, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/463,009

(22) Filed: Sep. 7, 2023

(65) Prior Publication Data

US 2024/0043748 A1 Feb. 8, 2024

Related U.S. Application Data

(63) Continuation of application No. PCT/JP2022/011179, filed on Mar. 14, 2022.

(30) Foreign Application Priority Data

Mar. 17, 2021 (JP) .................... 2021-044097

(51) Int. Cl.
G02F 1/1333 (2006.01)
C09K 19/34 (2006.01)
G02B 5/30 (2006.01)
H10K 59/80 (2023.01)

(52) U.S. Cl.
CPC ........ G02B 5/3016 (2013.01); C09K 19/3491 (2013.01); H10K 59/8791 (2023.02)

(58) Field of Classification Search
CPC .... C09K 19/32; C09K 19/34; C09K 19/3491; C09K 2019/0444; G02F 1/1333
See application file for complete search history.

(56) References Cited

U.S. PATENT DOCUMENTS

| | | | |
|---|---|---|---|
| 8,674,103 B2 * | 3/2014 | Ramirez | C07D 471/22 349/117 |
| 2004/0028839 A1 | 2/2004 | Paukshto et al. | |
| 2010/0215954 A1 | 8/2010 | Kuzmin et al. | |
| 2011/0013124 A1 | 1/2011 | Wang et al. | |
| 2011/0317102 A1 | 12/2011 | Ramirez et al. | |
| 2024/0043748 A1 * | 2/2024 | Hirai | C09K 19/3491 |

FOREIGN PATENT DOCUMENTS

| | | |
|---|---|---|
| JP | 2000-100484 A | 4/2000 |
| JP | 2006-243653 A | 9/2006 |
| JP | 2006-292910 A | 10/2006 |
| JP | 2011-513555 A | 4/2011 |
| JP | 2012-519303 A | 8/2012 |
| JP | 5302897 B2 | 10/2013 |

OTHER PUBLICATIONS

International Search Report issued in PCT/JP2022/011179 on May 24, 2022.
Written Opinion issued in PCT/JP2022/011179 on May 24, 2022.
International Preliminary Report on Patentability completed by WIPO on Sep. 12, 2023 in connection with International Patent Application No. PCT/JP2022/011179.

* cited by examiner

*Primary Examiner* — Geraldina Visconti
(74) *Attorney, Agent, or Firm* — Edwards Neils LLC; Jean C. Edwards, Esq.

(57) ABSTRACT

Provided are a composition capable of forming an optically anisotropic film exhibiting a negative Nz factor, an optically anisotropic film, a circularly polarizing plate, a display device, a compound, and a method for producing a compound. The composition includes a non-coloring lyotropic liquid crystal compound represented by Formula (X) $(R_{x1}\text{-}(L_{x1}\text{-}L_{x2}\text{-}R_{x2})_n)^{a-}(M^{b+})_c$.

20 Claims, 1 Drawing Sheet

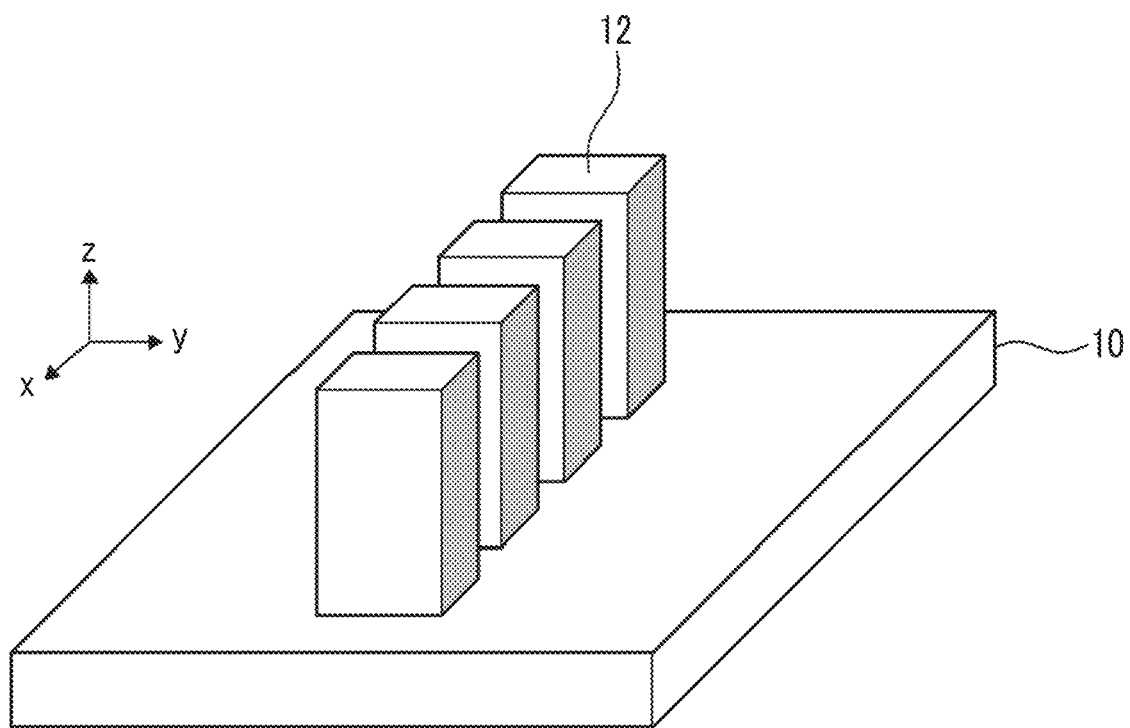

COMPOSITION, OPTICALLY ANISOTROPIC FILM, CIRCULARLY POLARIZING PLATE, DISPLAY DEVICE, COMPOUND, AND METHOD FOR PRODUCING COMPOUND

CROSS-REFERENCE TO RELATED APPLICATIONS

This application is a Continuation of PCT International Application No. PCT/JP2022/011179 filed on Mar. 14, 2022, which was published under PCT Article 21(2) in Japanese, and which claims priority under 35 U.S.C. § 119(a) to Japanese Patent Application No. 2021-044097 filed on Mar. 17, 2021. The above applications are hereby expressly incorporated by reference, in their entirety, into the present application.

BACKGROUND OF THE INVENTION

1. Field of the Invention

The present invention relates to a composition, an optically anisotropic film, a circularly polarizing plate, a display device, a compound, and a method for producing a compound.

2. Description of the Related Art

A phase difference film having refractive index anisotropy (optically anisotropic film) is applied to various uses such as an antireflection film of a display device and an optical compensation film of a liquid crystal display device.

For example, JP5302897B has proposed an optically anisotropic film formed of a composition exhibiting a lyotropic liquid crystallinity.

SUMMARY OF THE INVENTION

On the other hand, in recent years, an optically anisotropic film exhibiting a negative Nz factor has been required for an optically anisotropic film.

In a case where the present inventors examined the properties of the composition described in JP5302897B, it was not possible to obtain an optically anisotropic film exhibiting a negative Nz factor.

The present invention has been made in view of the above circumstances, and an object of the present invention is to provide a composition capable of forming an optically anisotropic film exhibiting a negative Nz factor.

Another object of the present invention is to provide an optically anisotropic film, a circularly polarizing plate, a display device, a compound, and a method for producing a compound.

As a result of extensive studies on the problems of the related art, the present inventors have found that the foregoing objects can be achieved by the following configurations.

(1) A composition including a non-coloring lyotropic liquid crystal compound represented by Formula (X) which will be described later.
(2) The composition according to (1), in which $M^{b+}$ represents any of organic cations represented by Formula (W1) to Formula (W8) which will be described later.
(3) The composition according to (1) or (2), in which an anionic group is $-SO_3^-$ or $-COO^-$.
(4) The composition according to any one of (1) to (3), in which n is 2, a is 2, b is 1, and c is 2.
(5) The composition according to (4), in which $R_{x1}$ is a divalent fused polycyclic group.
(6) An optically anisotropic film formed of the composition according to any one of (1) to (5).
(7) A circularly polarizing plate including the optically anisotropic film according to (6) and a polarizer.
(8) The circularly polarizing plate according to (7), in which an angle formed by an in-plane slow axis of the optically anisotropic film and an absorption axis of the polarizer is in a range of 45°±5°.
(9) A display device including the circularly polarizing plate according to (7) or (8) and a display element.
(10) The display device according to (9), in which the display element is an organic electroluminescent display element.
(11) A non-coloring lyotropic liquid crystal compound represented by Formula (X) which will be described later.
(12) The compound according to (11), in which $M^{b+}$ represents any of organic cations represented by Formula (W1) to Formula (W8) which will be described later.
(13) The compound according to (11) or (12), in which an anionic group is $-SO_3^-$ or $-COO^-$.
(14) The compound according to any one of (11) to (13), in which n is 2, a is 2, b is 1, and c is 2.
(15) The compound according to (14), in which $R_{x1}$ is a divalent fused polycyclic group.
(16) The method for producing the compound according to any one of (11) to (15), including a step of mixing a compound represented by Formula (Z1) which will be described later with a compound represented by Formula (Z2) which will be described later.

According to an aspect of the present invention, it is possible to provide a composition capable of forming an optically anisotropic film exhibiting a negative Nz factor.

According to another aspect of the present invention, it is possible to provide an optically anisotropic film, a circularly polarizing plate, a display device, a compound, and a method for producing a compound.

BRIEF DESCRIPTION OF THE DRAWINGS

FIG. 1 is a schematic diagram for explaining a structure of an optically anisotropic film of the present invention.

DESCRIPTION OF THE PREFERRED EMBODIMENTS

Hereinafter, the present invention will be described in more detail.

Any numerical range expressed using "to" in the present specification refers to a range including the numerical values before and after the "to" as a lower limit value and an upper limit value, respectively.

In addition, the slow axis and the fast axis are defined at a wavelength of 550 nm unless otherwise specified. That is, unless otherwise specified, for example, the term "slow axis direction" means a direction of a slow axis at a wavelength of 550 nm.

In the present invention, Re(λ) and Rth(λ) represent an in-plane retardation at a wavelength λ and a thickness direction retardation at a wavelength λ, respectively. Unless otherwise specified, the wavelength λ is 550 nm.

In the present invention, Re(λ) and Rth(λ) are values measured at a wavelength λ in AxoScan OPMF-1 (manufactured by Opto Science, Inc.). By inputting an average refractive index ((nx+ny+nz)/3) and a film thickness (d (μm)) in AxoScan, the following expressions can be calculated:

Slow axis direction(°)

Re(λ)=R0(λ)

Rth(λ)=((nx+ny)/2−nz)×d

Although R0(λ) is displayed as a numerical value calculated by AxoScan OPMF-1, R0(λ) means Re(λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case where the wavelength dependence is measured, the wavelength dependence can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. Examples of average refractive index values for major optical films are given below: cellulose acylate (1.48), cycloolefin polymer (1.52), polycarbonate (1.59), polymethyl methacrylate (1.49), and polystyrene (1.59).

In addition, in the present specification, the Nz factor is a value given by Nz=(nx−nz)/(nx−ny).

nx in a case of calculating the Nz factor of the optically anisotropic film is a refractive index in an in-plane slow axis direction of the optically anisotropic film, ny in a case of calculating the Nz factor of the optically anisotropic film is a refractive index in an in-plane fast axis direction of the optically anisotropic film, and nz in a case of calculating the Nz factor of the optically anisotropic film is a refractive index in a thickness direction of the optically anisotropic film.

nx, ny, and nz in a case of calculating the Nz factor are each refractive index at a wavelength of 550 nm.

In addition, in the present specification, a relationship between angles (for example, "orthogonal" or "parallel") is intended to include a range of errors acceptable in the art to which the present invention belongs. For example, it means that an angle is in an error range of ±5° with respect to the exact angle, and the error with respect to the exact angle is preferably in a range of ±3°.

The bonding direction of the divalent group (for example, —COO—) described in the present specification is not particularly limited. For example, in a case where L in X-L-Y is —COO— and then in a case where the position bonded to the X side is defined as *1 and the position bonded to the Y side is defined as *2, L may be *1—O—CO—*2 or *1—CO—O—*2.

A feature point of the composition according to the embodiment of the present invention is that the composition contains a predetermined compound.

The reason why a predetermined effect can be obtained by using the composition according to the embodiment of the present invention is presumed as follows.

The composition according to the embodiment of the present invention is a composition exhibiting lyotropic liquid crystallinity, and in a case of forming an optically anisotropic film, an alignment state is formed along a predetermined shearing direction. The non-coloring lyotropic liquid crystal compound (hereinafter, also simply referred to as "specific compound") represented by Formula (X) which will be described later, which is contained in the composition, has a ring structure inside thereof and has a plate-like structure as a whole. Therefore, as shown in FIG. 1, in a case where the composition is applied onto a support 10 and shearing is applied along the x-axis direction, a plurality of specific compounds 12 are disposed such that the planes of the plate-like structures face each other (in other words, the ring structures inside the compound face each other). Then, the column-like associates formed by the association of the specific compounds 12 with each other are disposed along the x-axis direction. At that time, as shown in FIG. 1, the specific compound 12 is disposed such that the major axis direction stands with respect to the support 10. Therefore, it is considered that an optically anisotropic film having a negative Nz factor can be formed.

The composition according to the embodiment of the present invention contains a specific compound.

In the following, first, the materials contained in the composition will be described in detail, and then the optically anisotropic film formed of the composition will be described in detail.

Specific Compound

The composition according to the embodiment of the present invention contains a non-coloring lyotropic liquid crystal compound represented by Formula (X).

$(R_{x1}-(L_{x1}-L_{x2}-R_{x2})_n)^{a-}(M^{b+})_c$  Formula (X)

The term "non-coloring" means that no absorption is exhibited in a visible light range. More specifically, it means that the absorbance in a visible light range (wavelength of 400 to 700 nm) is 0.1 or less in a case of measuring the ultraviolet-visible absorption spectrum of a solution in which the specific compound is dissolved at a concentration such that the absorbance at the maximum absorption wavelength in an ultraviolet light range (wavelength of 230 to 400 nm) is 1.0.

The specific compound is a lyotropic liquid crystal compound. Here, the lyotropic liquid crystal compound refers to a compound having a property of causing a phase transition between an isotropic phase and a liquid crystal phase by changing a temperature or a concentration in a solution state in which the compound is dissolved in a solvent.

The specific compound is preferably water-soluble from the viewpoint that it is easy to control the expression of liquid crystallinity. The water-soluble specific compound represents a specific compound that is dissolved in water at room temperature (25° C.) in an amount of 1% by mass or more, and is preferably dissolved in water at room temperature (25° C.) in an amount of 3% by mass or more.

The specific compound is a compound having a structure in which an aromatic ring (an aromatic hydrocarbon ring, an aromatic heterocyclic ring, or the like) spreads two-dimensionally through a single bond or an appropriate linking group, and therefore has a property of forming a column-like associate by the association of planes in the compound with each other in a solvent.

$R_{x1}$ represents an n-valent monocyclic group, an n-valent fused polycyclic group, or a residue obtained by removing n hydrogen atoms from a compound represented by Formula (Y1), and is preferably an n-valent fused polycyclic group.

$R_{y1}-R_{y2}$  Formula (Y1)

$R_{y1}$ and $R_{y2}$ each independently represent a monovalent fused polycyclic group.

Examples of the ring contained in the n-valent monocyclic group include a monocyclic hydrocarbon ring and a monocyclic heterocyclic ring. The monocyclic hydrocarbon ring may be a monocyclic aromatic hydrocarbon ring (preferably a benzene ring) or a monocyclic non-aromatic hydrocarbon ring. The monocyclic heterocyclic ring may be a monocyclic aromatic heterocyclic ring or a monocyclic non-aromatic heterocyclic ring.

The n-valent monocyclic group is preferably an n-valent monocyclic aromatic hydrocarbon ring group or an n-valent monocyclic aromatic heterocyclic ring group from the viewpoint that the aligning properties of the specific compound are more excellent.

The number of ring structures contained in the n-valent fused polycyclic group is not particularly limited, and is preferably 2 to 10, more preferably 3 to 10, still more preferably 3 to 6, and particularly preferably 3 to 4 from the viewpoint that the aligning properties of the specific compound are more excellent.

Examples of the ring contained in the n-valent fused polycyclic group include a hydrocarbon ring (for example, a monocyclic hydrocarbon ring) and a heterocyclic ring (for example, a monocyclic heterocyclic ring). The hydrocarbon ring may be an aromatic hydrocarbon ring or a non-aromatic hydrocarbon ring. The heterocyclic ring may be an aromatic heterocyclic ring or a non-aromatic heterocyclic ring.

The n-valent fused polycyclic group is preferably composed of aromatic hydrocarbon ring and heterocyclic ring from the viewpoint that the aligning properties of the specific compound are more excellent. The n-valent fused polycyclic group is preferably a conjugated linking group. That is, the n-valent fused polycyclic group is preferably a conjugated n-valent fused polycyclic group.

Examples of the ring constituting the n-valent fused polycyclic group include dibenzothiophene-S,S-dioxide (a ring represented by Formula (C1)), dinaphtho[2,3-b:2',3'-d]furan (a ring represented by Formula (C2)), 12H-benzo "b" phenoxazine (a ring represented by Formula (C3)), dibenzo[b,i]oxanthrene (a ring represented by Formula (C4)), benzo[b]naphtho[2',3':5,6]dioxino[2,3-i]oxanthrene (a ring represented by Formula (C5)), acenaphto[1,2-b]benzo[g]quinoxaline (a ring represented by Formula (C6)), 9H-acenaphto[1,2-b]imidazo[4,5-g]quinoxaline (a ring represented by Formula (C7)), dibenzo[b,def]chrysene-7,14-dione (a ring represented by Formula (C8)), acetonaphto-quinoxaline (a ring represented by Formula (C9)), benzo[1,2-d:4,5-d']b is(oxazole) (a ring represented by Formula (C10)), 1,5-dihydrobenzo[1,2-d:4,5-d']diimidazole (a ring represented by Formula (C11)), benzo[4,5]imidazo[1,2-c]quinazolin-6(5H)-one (a ring represented by Formula (C12)), benzo[4,5]imidazo[1,2-a]benzo[4,5]imidazo[1,2-c]benzo[4,5]imidazo[1,2-e][1,3,5]triazine (a ring represented by Formula (C13)), naphthalene (a ring represented by Formula (C14)), 2H-chromene (a ring represented by Formula (C15)), 4H-benzo[d][1,3]oxazin-4-one (a ring represented by Formula (C16)), anthracene (a ring represented by Formula (C17)), acridine (a ring represented by Formula (C18)), phenazine (a ring represented by Formula (C19)), thianthrene (a ring represented by Formula (C20)), phenanthrene (a ring represented by Formula (C21)), chrysene (a ring represented by Formula (C22)), triphenylene (a ring represented by Formula (C23)), pyrene (a ring represented by Formula (C24)), fluoranthene (a ring represented by Formula (C25)), 9H-carbazole (a ring represented by Formula (C26)), dibenzo[b,d]furan (a ring represented by Formula (C27)), dibenzo[b,d]thiophene (a ring represented by Formula (C28)), benzo[1,2-b:4,5-b']dithiophene (a ring represented by Formula (C29)), 10H-phenoxazine (a ring represented by Formula (C30)), 10H-phenothiazine (a ring represented by Formula (C31)), perylene (a ring represented by Formula (C32)), and tribenzo[f,k,m]tetraphene (a ring represented by Formula (C33)).

That is, examples of the n-valent fused polycyclic group include n-valent groups formed by removing n hydrogen atoms from the rings represented by Formula (C1) to Formula (C33).

Above all, the divalent fused polycyclic group is preferably a divalent group formed by removing two hydrogen atoms from the rings represented by Formula (C1) to Formula (C33).

In addition, the trivalent fused polycyclic group is preferably a trivalent group formed by removing three hydrogen atoms from the ring represented by Formula (C13).

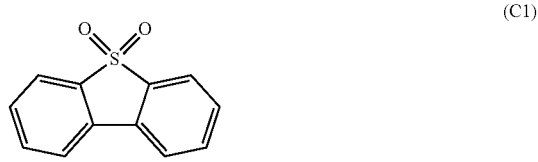

(C1)

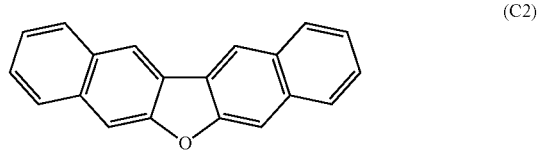

(C2)

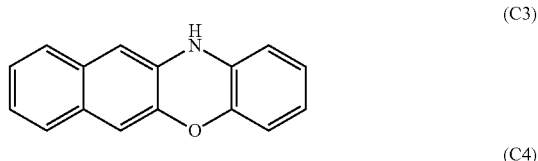

(C3)

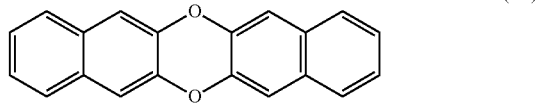

(C4)

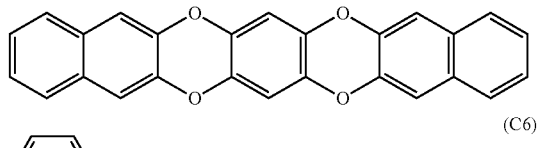

(C5)

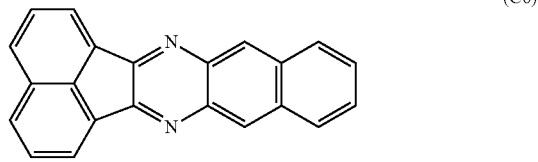

(C6)

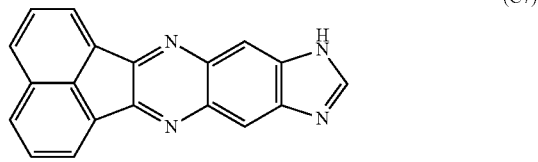

(C7)

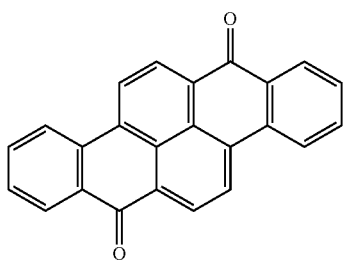
(C8)
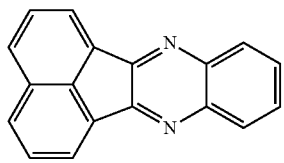
(C9)
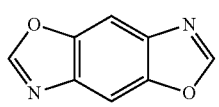
(C10)
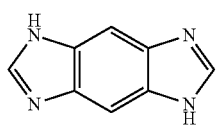
(C11)
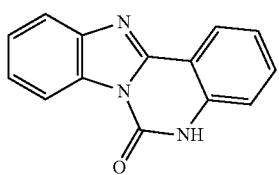
(C12)
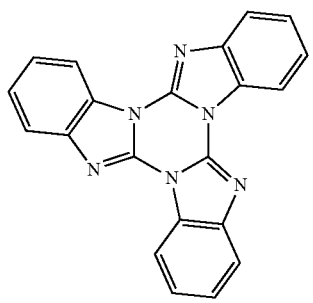
(C13)
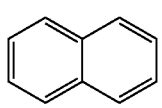
(C14)
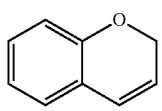
(C15)
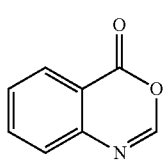
(C16)
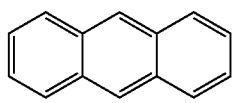
(C17)
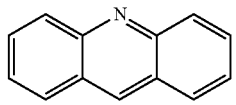
(C18)
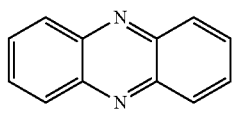
(C19)
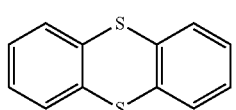
(C20)
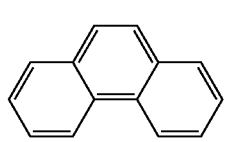
(C21)
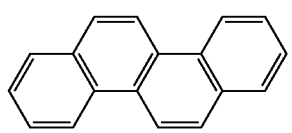
(C22)
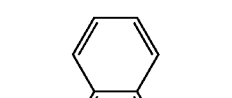
(C23)
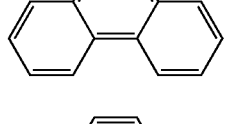
(C24)
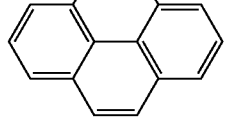
(C25)
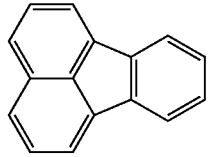
(C26)
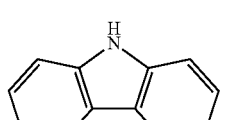
(C26)
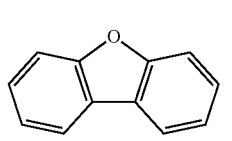
(C27)

(C28)
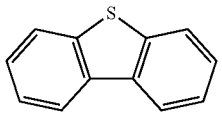

(C29)
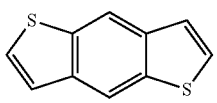

(C30)
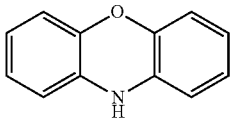

(C31)
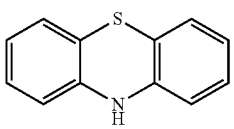

(C32)
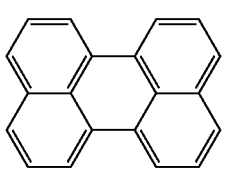

(C33)
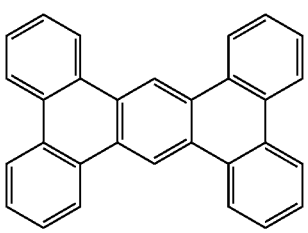

The residue obtained by removing n hydrogen atoms from a compound represented by Formula (Y1) is a group formed by removing any n hydrogen atoms in the compound represented by Formula (Y1).

$$R_{y1}-R_{y2} \quad \text{Formula (Y1)}$$

$R_{y1}$ and $R_{y2}$ each independently represent a monovalent fused polycyclic group.

For example, in a case where one hydrogen atom is removed from each of $R_{y1}$ and $R_{y2}$, the residue represents the following divalent group. * represents a bonding position.

$$*-R_{y11}-R_{y12}-*$$

$R_{y11}$ and $R_{y12}$ each independently represent a divalent fused polycyclic group.

The number of ring structures contained in the monovalent fused polycyclic group is not particularly limited, and is preferably 2 to 10, more preferably 2 to 4, and still more preferably 2 from the viewpoint that the aligning properties of the specific compound are more excellent.

Examples of the ring contained in the monovalent fused polycyclic group include a hydrocarbon ring and a heterocyclic ring. The hydrocarbon ring may be an aromatic hydrocarbon ring or a non-aromatic hydrocarbon ring. The heterocyclic ring may be an aromatic heterocyclic ring or a non-aromatic heterocyclic ring.

The monovalent fused polycyclic group is preferably composed of aromatic hydrocarbon ring and heterocyclic ring from the viewpoint that the aligning properties of the specific compound are more excellent. The monovalent fused polycyclic group is preferably a conjugated linking group. That is, the monovalent fused polycyclic group is preferably a conjugated monovalent fused polycyclic group.

Examples of the compound represented by Formula (Y1) include compounds represented by Formula (C14) to Formula (C16).

(C14)
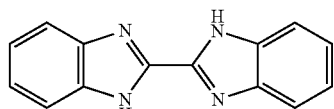

(C15)
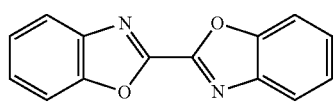

(C16)
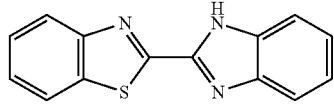

$L_{x1}$ represents a single bond, a divalent aromatic ring group, or a group represented by Formula (Y2).

In a case where n is 2 or more, a plurality of $L_{x1}$'s may be the same or different from each other.

$$*-R_{y3}-(R_{y4})_m-* \quad \text{Formula (Y2)}$$

$R_{y3}$ and $R_{y4}$ each independently represent a divalent aromatic ring group. In a case where m is 2, the two $R_{y4}$'s may be the same or different from each other.

m represents 1 or 2. * represents a bonding position.

The aromatic ring constituting the divalent aromatic ring group represented by $L_{x1}$ may have a monocyclic structure or a polycyclic structure.

Examples of the aromatic ring constituting the divalent aromatic ring group include an aromatic hydrocarbon ring and an aromatic heterocyclic ring. That is, examples of the divalent aromatic ring group represented by $L_{x1}$ include a divalent aromatic hydrocarbon ring group and a divalent aromatic heterocyclic ring group.

Examples of the aromatic hydrocarbon ring include a benzene ring and a naphthalene ring.

Examples of the divalent aromatic hydrocarbon ring group include the following group. * represents a bonding position.

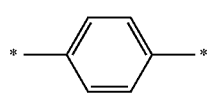

Examples of the aromatic heterocyclic ring include a pyridine ring, a thiophene ring, a pyrimidine ring, a thiazole ring, a furan ring, a pyrrole ring, an imidazole ring, and an indole ring.

Examples of the divalent aromatic heterocyclic ring group include the following groups. * represents a bonding position.

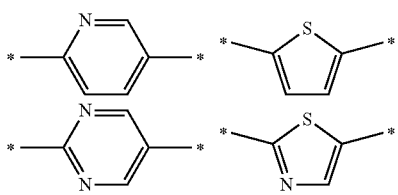

The definition of the divalent aromatic ring group represented by $R_{y3}$ and $R_{y4}$ is also the same as that of the divalent aromatic ring group represented by $L_{x1}$.

In this regard, in a case where $R_{x1}$ is an n-valent monocyclic group, at least one of n $L_{x1}$'s represents a divalent aromatic ring group or a group represented by Formula (Y2). For example, in a case where $R_{x1}$ is a divalent monocyclic group, at least one of the two $L_{x1}$'s represents a divalent aromatic ring group or a group represented by Formula (Y2).

$L_{x2}$ represents a single bond, —O—, —S—, —CO—, —$NR_{x4}$—, —SO—, —$SO_2$—, an alkylene group, an alkenylene group, an alkynylene group, or a group formed by a combination thereof. $R_{x4}$ represents a hydrogen atom or an alkyl group. In a case where n is 2 or more, a plurality of $L_{x2}$'s may be the same or different from each other.

Examples of the group formed by a combination thereof include an —O-alkylene group- and an —S-alkylene group-.

The number of carbon atoms in the alkylene group is not particularly limited, and is preferably 1 to 3 and more preferably 1 from the viewpoint that the aligning properties of the specific compound are more excellent.

The number of carbon atoms in the alkenylene group and the alkynylene group is not particularly limited, and is preferably 2 to 5 and more preferably 2 to 4 from the viewpoint that the aligning properties of the specific compound are more excellent.

$R_{x2}$ represents an anionic group. In a case where n is 2 or more, a plurality of $R_{x2}$'s may be the same or different from each other.

Examples of the anionic group include a monovalent anionic group such as —$SO_3^-$ (—$S(=O)_2$—$O^-$) or —$COO^-$, and a divalent anionic group such as —$OPO_3^{2-}$, among which —$SO_3^-$ is preferable from the viewpoint that the aligning properties of the specific compound are more excellent. With regard to the —$SO_3^-$, as represented by *—$SO_3^-$, a portion of * serves as a bonding position. In addition, with regard to the —$COO^-$, as represented by *—$COO^-$, a portion of * serves as a bonding position.

In a case where the anionic group is a monovalent anionic group such as —$SO_3^-$ (—$S(=O)_2$—$O^-$) or —$COO^-$, the number of a and the number of n are the same.

Therefore, in a case where the anionic group is a monovalent anionic group such as —$SO_3^-$ (—$S(=O)_2$—$O^-$) or —$COO^-$, Formula (X) can be expressed as follows. Even in a case where Formula (X) is represented by the following formula, the relationship of Expression (1) which will be described later is satisfied.

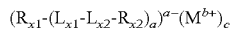

n represents an integer of 1 or more. Above all, n is preferably an integer of 1 to 4, more preferably 2 or 3, and still more preferably 2, from the viewpoint that the aligning properties of the specific compound are more excellent.

$M^{b+}$ represents a b-valent organic cation that has neither a hydrogen atom bonded to a quaternary nitrogen atom, a hydrogen atom bonded to a quaternary phosphorus atom, nor a hydrogen atom bonded to a tertiary sulfur atom. In a case where c is 2 or more, a plurality of $M^{b+}$'s may be the same or different from each other.

The organic cation contains a carbon atom, and optionally further contains an oxygen atom, a nitrogen atom, a sulfur atom, or a hydrogen atom.

The hydrogen atom bonded to a quaternary nitrogen atom means a dashed hydrogen atom bonded to a quaternized nitrogen atom, as represented by the following formula.

For example, organic cations represented by the following formulae correspond to organic cations having a hydrogen atom bonded to a quaternary nitrogen atom.

The hydrogen atom bonded to a quaternary phosphorus atom means a dashed hydrogen atom bonded to a quaternized phosphorus atom, as represented by the following formula.

The hydrogen atom bonded to a tertiary sulfur atom means a dashed hydrogen atom bonded to a tertiary sulfur atom, as represented by the following formula.

Examples of the organic cation include an organic ammonium cation, an organic imidazolium cation, an organic sulfonium cation, an organic iodonium cation, and an organic phosphonium cation.

From the viewpoint that the aligning properties of the specific compound are more excellent, $M^{b+}$ is preferably any of organic cations represented by Formula (W1) to Formula (W8) and more preferably an organic cation represented by Formula (W1) or Formula (W2). The organic cations represented by Formula (W1) to Formula (W8) correspond to organic cations in which b corresponds to 1.

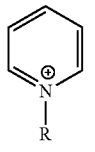
(W3)

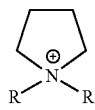
(W4)

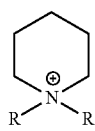
(W5)

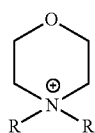
(W6)

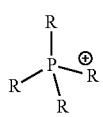
(W7)

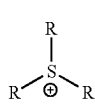
(W8)

R's each independently represent a substituent. The substituent contains neither a hydrogen atom bonded to a quaternary nitrogen atom, a hydrogen atom bonded to a quaternary phosphorus atom, nor a hydrogen atom bonded to a tertiary sulfur atom.

Examples of the substituent include an alkyl group, an alkenyl group, an alkynyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, an alkylthio group, an arylthio group, an aromatic heterocyclic thio group, a ureido group, a hydroxyl group, a halogen atom, a cyano group, a hydrazino group, a heterocyclic group (for example, a heteroaryl group), a silyl group, and a group formed by a combination thereof. The substituent may be further substituted with a substituent.

Above all, from the viewpoint that the aligning properties of the specific compound are more excellent, a hydrocarbon group which may have a substituent is preferable as the substituent represented by R.

Examples of the hydrocarbon group include an alkyl group, an alkenyl group, an alkynyl group, and an aryl group, among which an alkyl group is preferable.

The number of carbon atoms in the alkyl group is not particularly limited, and is preferably 1 to 10, more preferably 1 to 5, and still more preferably 1 to 2, from the viewpoint that the aligning properties of the specific compound are more excellent.

The number of carbon atoms in the alkenyl group and the alkynyl group is not particularly limited, and is preferably 2 to 10, more preferably 2 to 4, and still more preferably 2, from the viewpoint that the aligning properties of the specific compound are more excellent.

Examples of the substituent which the hydrocarbon group may have include the groups exemplified above as the substituent, among which a hydrophilic group is preferable. Examples of the hydrophilic group include a hydroxyl group and a group having a polyalkylene oxide chain.

In addition, a group having a polymerizable group is also suitably mentioned as the substituent represented by R. Examples of the polymerizable group include a (meth)acryloyl group, an epoxy group, and a vinyl group. The alkenyl group also corresponds to the group having a polymerizable group.

a to c each independently represent an integer of 1 or more and satisfy the relationship of Expression (1).

$$a = b \times c \qquad \text{Expression (1)}$$

a represents the valence (ion valence) of the anion of the $(R_{x1}\text{-}(L_{x1}\text{-}L_{x2}\text{-}R_{x2})_n)$ portion, b represents the valence (ion valence) of the organic cation, and c represents the number of $M^{b+}$.

a is preferably an integer of 1 to 4, more preferably 2 or 3, and still more preferably 2. In a case where the anionic group represented by $R_{x2}$ is a monovalent anionic group such as $-SO_3^-$ ($-S(=O)_2-O^-$) or $-COO^-$, a and n represent the same number.

b is preferably 1 or 2 and more preferably 1.

c is preferably an integer of 1 to 4, more preferably 2 or 3, and still more preferably 2.

Above all, it is preferable that n is 2, a is 2, b is 1, and c is 2, from the viewpoint that the aligning properties of the specific compound are more excellent.

In addition, a and n satisfy the relationship of Expression (2).

$$a = \text{total of valences of anionic groups represented by } n\ R_{x2}\text{'s} \qquad \text{Expression (2)}$$

The anionic group in Expression (2) represents an anionic group represented by $R_{x2}$. That is, Expression (2) means that the value of a is the same as the total value of the valences of anionic groups represented by n $R_{x2}$'s.

The valence (ion valence) of the anionic group is, for example, 1 in a case where the anionic group is a monovalent anionic group such as $-SO_3^-$ ($-S(=O)_2-O^-$) or $-COO^-$ and 2 in a case where the anionic group is a divalent anionic group such as $-OPO_3^{2-}$.

For example, in a case where n is 2 and both of the two $R_{x2}$'s are $-SO_3^-$, the value of the right side of Expression (2) is 2 (=1+1). In addition, in a case where n is 2, one $R_{x2}$ is $-SO_3^-$, and the other $R_{x2}$ is $-OPO_3^{2-}$, the value of the right side of Expression (2) is 3 (=1+2).

The compound represented by Formula (X) is preferably a compound represented by Formula (V) from the viewpoint that the aligning properties of the specific compound are more excellent.

$$(R_{v2}\text{-}L_{v2}\text{-}L_{v1}\text{-}R_{v1}\text{-}L_{v1}\text{-}L_{v2}\text{-}R_{v2})^{2-}(M^+)_2 \qquad \text{Formula (V)}$$

$R_{v1}$ in Formula (V) represents a divalent monocyclic group, a divalent fused polycyclic group, or a residue obtained by removing two hydrogen atoms from the compound represented by Formula (Y1). The suitable aspect of each group represented by $R_{v1}$ is the same as the suitable aspect of each group represented by $R_{x1}$ described in Formula (X).

$L_{v1}$'s in Formula (V) each independently represent a single bond, a divalent aromatic ring group, or a group represented by Formula (Y2). In this regard, in a case where $R_{v1}$ is a divalent monocyclic group, at least one of the two $L_{v1}$'s represents a divalent aromatic ring group or a group represented by Formula (Y2). The suitable aspect of each group represented by $L_{v1}$ is the same as the suitable aspect of each group represented by $L_{x1}$ described in Formula (X).

$L_{v2}$'s each independently represent a single bond, —O—, —S—, —CO—, —$NR_{x4}$—, —SO—, —$SO_2$—, an alkylene group, an alkenylene group, an alkynylene group, or a group formed by a combination thereof. $R_{x4}$ represents a hydrogen atom or an alkyl group. The suitable aspect of each group represented by $L_{v2}$ is the same as the suitable aspect of each group represented by $L_{x2}$ described in Formula (X).

$R_{v2}$'s each independently represent —$SO_3^-$ or —COO—.

$M^+$'s each independently represent a monovalent organic cation that has neither a hydrogen atom bonded to a quaternary nitrogen atom, a hydrogen atom bonded to a quaternary phosphorus atom, nor a hydrogen atom bonded to a tertiary sulfur atom. Suitable aspects of $M^+$ include any of the organic cations represented by Formula (W1) to Formula (W8) described above.

The method for producing the specific compound is not particularly limited, and the specific compound can be produced based on a known method.

Above all, a production method including a step of mixing a compound represented by Formula (Z1) and a compound represented by Formula (Z2) is preferable from the viewpoint that the productivity of the specific compound is more excellent and the properties of the obtained specific compound are more excellent. By mixing the compound represented by Formula (Z1) and the compound represented by Formula (Z2), a hydrogen cation ($H^+$) of an acid group in $R_{x3}$ is exchanged with an organic cation ($M^{b+}$) contained in the compound represented by Formula (Z2) to produce the specific compound.

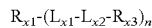  Formula (Z1)

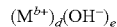  Formula (Z2)

The definitions of $R_{x1}$, $L_{x1}$, $L_{x2}$, and n in Formula (Z1) are the same as those of $R_{x1}$, $L_{x1}$, $L_{x2}$, and n in Formula (X) described above.

$R_{x3}$ represents an acid group. In a case where n is 2 or more, a plurality of $R_{x3}$'s may be the same or different from each other.

Examples of the acid group include —$SO_3H$ (sulfo group) and —COOH (carboxyl group), among which —$SO_3H$ is preferable from the viewpoint that the aligning properties of the specific compound are more excellent.

The definitions of $M^{b+}$ and b in Formula (Z2) are the same as those of $M^{b+}$ and b in Formula (X) described above.

d and e each independently represent an integer of 1 or more and satisfy the relationship of Expression (3).

$$e = b \times d \qquad \text{Expression (3)}$$

d is preferably 1 or 2 and more preferably 1.

e is preferably 1 to 4, more preferably 1 or 2, and still more preferably 1.

The method of mixing the compound represented by Formula (Z1) and the compound represented by Formula (Z2) is not particularly limited, and it is preferable to mix the two compounds in the presence of a solvent.

The solvent is not particularly limited, and examples thereof include water and an organic solvent. Examples of the organic solvent include an alcohol-based solvent, an ether-based solvent, an amide-based solvent, and an ester-based solvent.

The mixing ratio of the compound represented by Formula (Z1) and the compound represented by Formula (Z2) is not particularly limited, and the mass ratio of the compound represented by Formula (Z1) to the compound represented by Formula (Z2) (compound represented by Formula (Z1)/compound represented by Formula (Z2)) is preferably 0.1 to 10, more preferably 0.2 to 5, and still more preferably 0.5 to 2.

Other Components

The composition according to the embodiment of the present invention may contain components other than the specific compound.

The composition may contain a solvent. Examples of the solvent include a polar solvent such as water, an alcohol-based solvent, an ether-based solvent, an amide-based solvent, or an ester-based solvent, and a non-polar solvent such as hexane. Above all, the solvent is preferably a polar solvent, and more preferably water or alcohol-based solvent.

Examples of the additives that may be contained in the composition according to the embodiment of the present invention include a polymerizable compound, a polymerization initiator, a wavelength dispersion control agent, an optical properties modifier, a surfactant, an adhesion improver, a slipping agent, an alignment control agent, and an ultraviolet absorber, in addition to the foregoing components.

Composition of Composition

The composition according to the embodiment of the present invention contains at least a specific compound.

The composition according to the embodiment of the present invention corresponds to a lyotropic liquid crystalline composition.

Here, the lyotropic liquid crystalline composition is a composition having a property of causing a phase transition between an isotropic phase and a liquid crystal phase by changing a temperature or a concentration in a solution state. That is, the composition is a composition capable of exhibiting lyotropic liquid crystallinity by adjusting the concentration of each compound or the like in a solution state containing various components such as a specific compound and a solvent. Even in a case where a composition contains an excess solvent and does not exhibit lyotropic liquid crystallinity in that state, the composition corresponds to the above-mentioned lyotropic liquid crystalline composition in a case where the lyotropic liquid crystallinity is exhibited upon changes in the concentration, such as a case where the lyotropic liquid crystallinity is exhibited in a drying step after application of the composition.

The content of the specific compound in the composition according to the embodiment of the present invention is not particularly limited, and is preferably 60% to 100% by mass and more preferably 80% to 99% by mass with respect to the total solid content in the composition.

The total solid content means components capable of forming an optically anisotropic film, excluding a solvent. Even in a case where the properties of the components are liquids, those components are calculated as the solid content.

The composition according to the embodiment of the present invention may contain only one type of specific compound, or may contain two or more types of specific compounds.

As described above, the composition according to the embodiment of the present invention may contain a solvent.

The concentration of solid contents in the composition according to the embodiment of the present invention is not particularly limited, and is preferably 1% to 50% by mass and more preferably 3% to 30% by mass with respect to the total mass of the composition, from the viewpoint that the lyotropic liquid crystallinity is easily exhibited.

As described above, the composition according to the embodiment of the present invention is a lyotropic liquid crystalline composition. Therefore, the composition according to the embodiment of the present invention may be in an aspect that contains a predetermined amount of a solvent and exhibits lyotropic liquid crystallinity (a state in which lyotropic liquid crystallinity is exhibited), or may be a composition that contains an excessive amount of a solvent and does not exhibit lyotropic liquid crystallinity in that state (exhibits an isotropic phase), but exhibits lyotropic liquid crystallinity during the formation of a coating film due to volatilization of the solvent in a case where an optically anisotropic film is formed.

As will be described later, in a case where an alignment film is disposed on a support, the lyotropic liquid crystallinity is exhibited in the drying process after the application of the composition, thereby inducing the alignment of the compound and making it possible to form an optically anisotropic film.

Method for Producing Optically Anisotropic Film

The method for producing the optically anisotropic film according to the embodiment of the present invention is not particularly limited as long as the above-mentioned composition according to the embodiment of the present invention is used. For example, a method of applying the composition according to the embodiment of the present invention and aligning the specific compound in a coating film to form an optically anisotropic film is preferable.

Hereinafter, the procedure of the above method will be described in detail.

First, the composition according to the embodiment of the present invention is applied. Usually, the composition according to the embodiment of the present invention is often applied onto a support.

The support used is a member that functions as a substrate for applying the composition according to the embodiment of the present invention. The support may be a so-called temporary support.

Examples of the support (temporary support) include a plastic substrate and a glass substrate. Examples of the material constituting the plastic substrate include a polyester resin such as polyethylene terephthalate, a polycarbonate resin, a (meth)acrylic resin, an epoxy resin, a polyurethane resin, a polyamide resin, a polyolefin resin, a cellulose resin, a silicone resin, and a polyvinyl alcohol.

The thickness of the support may be about 5 to 1,000 µm, and is preferably 10 to 250 µm and more preferably 15 to 90 µm.

If necessary, an alignment film may be disposed on the support.

The alignment film generally contains a polymer as a main component. The polymer for the alignment film is described in a large number of documents, and a large number of commercially available polymer products are available. The polymer for the alignment film is preferably a polyvinyl alcohol, a polyimide, or a derivative thereof.

It is preferable that the alignment film is subjected to a known rubbing treatment.

In addition, a photo-alignment film may be used as the alignment film.

The thickness of the alignment film is preferably 0.01 to 10 µm and more preferably 0.01 to 1 µm.

The application method may be, for example, a known method, examples of which include a curtain coating method, an extrusion coating method, a roll coating method, a dip coating method, a spin coating method, a print coating method, a spray coating method, and a slide coating method.

In addition, in a case where an application method in which shearing is applied is adopted, two treatments of specific compound alignment and application can be carried out at the same time.

In addition, the specific compound may be continuously aligned at the same time as the application by means of continuous application. Examples of the continuous application include a curtain coating method, an extrusion coating method, a roll coating method, and a slide coating method. A die coater, a blade coater, or a bar coater is preferably used as a specific application device.

The method in which shearing is applied can be mentioned as described above, as a method for aligning the specific compound in the coating film.

If necessary, the coating film formed on the support may be subjected to a heating treatment.

The conditions in a case of heating the coating film are not particularly limited, and the heating temperature is preferably 50° C. to 250° C., and the heating time is preferably 10 seconds to 10 minutes.

In addition, after heating the coating film, the coating film may be cooled if necessary. The cooling temperature is preferably 20° C. to 200° C. and more preferably 20° C. to 150° C.

The method in which an alignment film is used can be mentioned as described above, as another method for aligning the specific compound in the coating film.

The alignment direction can be controlled by subjecting the alignment film to an alignment treatment in advance in a predetermined direction. In particular, the method of using an alignment film is preferable in a case where continuous application is carried out using a roll-like support and then in a case where the compound is aligned in a direction oblique to a transport direction.

In the method of using an alignment film, the concentration of the solvent in the composition used is not particularly limited, and may be a concentration such that the composition exhibits lyotropic liquid crystallinity, or may be a concentration equal to or higher than or equal to or lower than that concentration. As described above, the composition according to the embodiment of the present invention is a lyotropic liquid crystalline composition, and therefore even in a case where the concentration of the solvent in the composition is high (even in a case where the composition itself exhibits an isotropic phase), the lyotropic liquid crystallinity is exhibited in the drying process after the application of the composition, thereby inducing the alignment of the compound on the alignment film and making it possible to form an optically anisotropic film.

After forming the optically anisotropic film, a treatment for fixing the alignment state of the specific compound may be carried out, if necessary.

The method of fixing the alignment state of the specific compound is not particularly limited, and may be, for example, the method of heating and then cooling a coating film as described above.

In addition, the method of fixing the alignment state of the specific compound may be, for example, a method of subjecting a coating film to a curing treatment in a case where the specific compound has a polymerizable group such as an alkenyl group. Examples of the curing treatment include a light irradiation treatment and a heating treatment.

Properties of Optically Anisotropic Film

The Nz factor of the optically anisotropic film according to the embodiment of the present invention shows a negative value. Above all, the Nz factor is preferably −0.45 to −0.10 and more preferably −0.30 to −0.15.

The Re(550) of the optically anisotropic film is not particularly limited, and is preferably 110 to 160 nm and more preferably 120 to 150 nm from the viewpoint that the optically anisotropic film is useful as a λ/4 plate.

The Rth(550) of the optically anisotropic film is not particularly limited, and is preferably −50 to 40 nm and more preferably −40 to 30 nm.

The thickness of the optically anisotropic film is not particularly limited, and is preferably 10 μm or less, more preferably 0.5 to 8.0 μm, and still more preferably 0.5 to 6.0 μm from the viewpoint of thickness reduction.

In the present specification, the thickness of the optically anisotropic film is intended to mean an average thickness of the optically anisotropic film. The average thickness is obtained by measuring the thicknesses of the optically anisotropic film at any five or more points and arithmetically averaging the measured values.

Uses

The above-mentioned optically anisotropic film can be applied to various uses and can be used, for example, as a so-called λ/4 plate or λ/2 plate by adjusting the in-plane retardation of the optically anisotropic film.

The λ/4 plate is a plate having a function of converting linearly polarized light having a specific wavelength into circularly polarized light (or converting circularly polarized light into linearly polarized light). More specifically, the λ/4 plate is a plate exhibiting an in-plane retardation Re of λ/4 (or an odd multiple of λ/4) at a predetermined wavelength of λ nm.

The in-plane retardation at a wavelength of 550 nm (Re(550)) of the λ/4 plate may have an error of about 25 nm centered on an ideal value (137.5 nm), and is, for example, preferably 110 to 160 nm and more preferably 120 to 150 nm.

In addition, the λ/2 plate refers to an optically anisotropic film in which the in-plane retardation Re(λ) at a specific wavelength of λ nm satisfies Re(λ)≈λ/2. This expression may be achieved at any wavelength (for example, 550 nm) in a visible light range. Above all, it is preferable that the in-plane retardation Re(550) at a wavelength of 550 nm satisfies the following relationship.

210 nm≤Re(550)≤300 nm

Optical Film

The optically anisotropic film may be used as an optical film in combination with another layer. That is, the optical film of the present invention includes the above-mentioned optically anisotropic film and another layer.

Examples of the other layer include the above-mentioned alignment film and a support.

The arrangement position of the optically anisotropic film in the optical film is not particularly limited, and for example, there is an aspect having a support, an alignment film, and an optically anisotropic film in this order.

Polarizing Plate

The optically anisotropic film according to the embodiment of the present invention can be suitably applied to a polarizing plate.

That is, the polarizing plate (preferably the circularly polarizing plate) according to the embodiment of the present invention includes the optically anisotropic film according to the embodiment of the present invention or the optical film of the present invention and a polarizer. The circularly polarizing plate is an optical element that converts unpolarized light into circularly polarized light.

It is sufficient that the polarizer is a member having a function of converting light into specific linearly polarized light (linear polarizer), and an absorption type polarizer can be mainly used.

Examples of the absorption type polarizer include an iodine-based polarizer, a dye-based polarizer using a dichroic dye, and a polyene-based polarizer. The iodine-based polarizer and the dye-based polarizer are each classified into a coating type polarizer and a stretching type polarizer, any of which can be applied. A polarizer prepared by adsorbing iodine or a dichroic dye onto a polyvinyl alcohol, followed by stretching is preferable.

The relationship between the slow axis of the optically anisotropic film and the absorption axis of the polarizer is not particularly limited. In a case where the optically anisotropic film is a λ/4 plate and the polarizing plate is used as a circularly polarizing plate, the angle formed by the in-plane slow axis of the optically anisotropic film and the absorption axis of the polarizer is preferably in a range of 45°±10°. That is, the angle formed by the in-plane slow axis of the optically anisotropic film and the absorption axis of the polarizer is preferably in a range of 35° to 55°.

Display Device

The circularly polarizing plate according to the embodiment of the present invention can be suitably applied to a display device. That is, the circularly polarizing plate according to the embodiment of the present invention can be suitably used as a so-called antireflection film.

The display device according to the embodiment of the present invention includes a display element and the above-mentioned circularly polarizing plate. The circularly polarizing plate is disposed on a viewing side, and the polarizer is disposed on the viewing side in the circularly polarizing plate.

The display device is not particularly limited, and examples thereof include an organic EL display element and a liquid crystal display element, among which an organic EL display element is preferable.

EXAMPLES

Hereinafter, features of the present invention will be described in more detail with reference to Examples and Comparative Examples. The materials, amounts of materials used, proportions, treatment details, and treatment procedure shown in Examples given below can be appropriately modified without departing from the spirit and scope of the present invention. Accordingly, the scope of the present invention should not be construed as being limited by the specific examples given below.

Synthesis

Compounds I-1 to I-4 and compounds II-1 to II-5, which will be shown below, were synthesized by known methods.

All of the compounds I-1 to I-4 exhibited lyotropic liquid crystallinity as described later.

In a case of measuring an ultraviolet-visible absorption spectrum of a solution in which each of the compounds I-1 to I-4 was dissolved at a concentration such that the absorbance at the maximum absorption wavelength in an ultraviolet light range (wavelength of 230 to 400 nm) was 1.0, the absorbance in a visible light range (wavelength of 400 to 700 nm) was 0.1 or less.

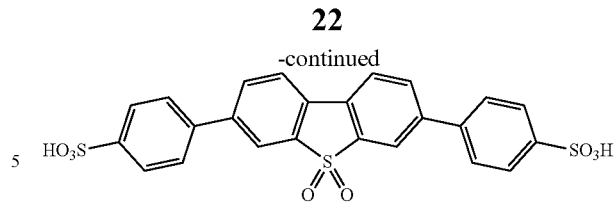

Synthesis of Compound I-2

10 ml of an Intermediate H aqueous solution (Intermediate H concentration: $3.784 \times 10^{-2}$ mmol/ml) was added to 5.844 g (0.1295 mol/g) of a choline aqueous solution (manufactured by Tokyo Chemical Industry Co., Ltd.), which was then stirred at room temperature for 12 hours.

(I-1)

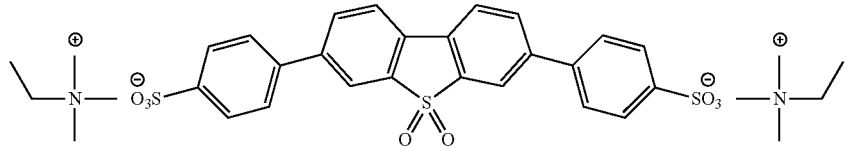

(I-2)

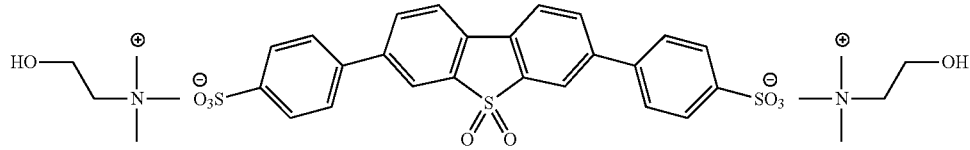

(I-3)

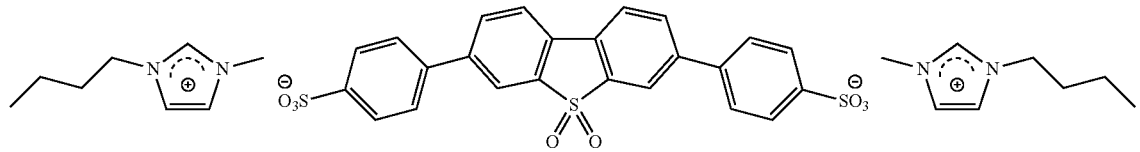

(I-4)

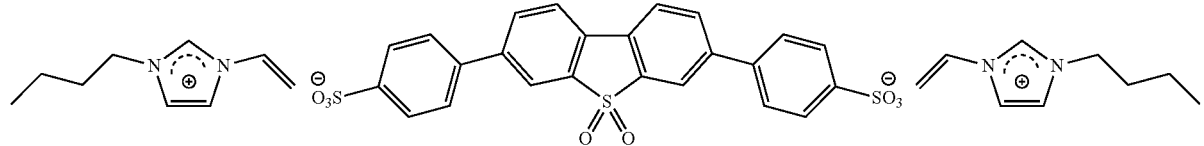

Hereinafter, methods for synthesizing the compounds I-2 to I-4 will be shown. Other compounds were synthesized with reference to those synthesis methods.

Synthesis of Intermediate H

Intermediate H (refer to the scheme below) was synthesized according to the method described in Liquid Crystals, Vol. 37, No. 11, November 2010, pp. 1439 to 1451.

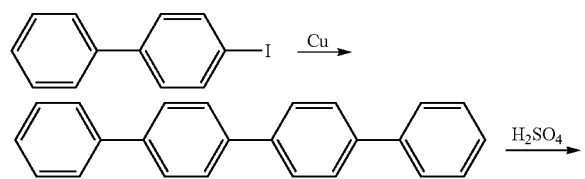

Thereafter, the solvent was distilled off from the obtained solution under reduced pressure, followed by vacuum drying under heating to obtain a compound I-2.

Synthesis of Hydroxide Salt Bmim(OH)

1-methylimidazole and 1.1-fold mol of 1-bromobutane with respect to 1-methylimidazole were mixed in acetonitrile, and the obtained solution was stirred at room temperature for 24 hours under an inert gas atmosphere. After the completion of the reaction, volatile components were distilled off from the obtained solution under reduced pressure, and the residue was washed with diethyl ether. The obtained solid content was vacuum-dried at room temperature for 24 hours to obtain Bmim(Br) as a white solid (refer to the scheme below).

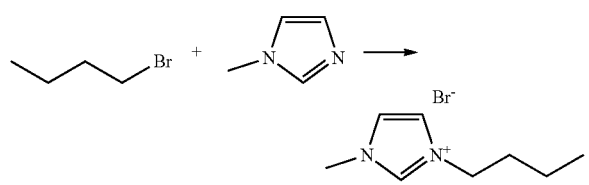

After dissolving the prepared Bmim(Br) in water, anion exchange was carried out using an ion exchange resin Amberlite IRN-78 to obtain Bmim(OH) as an aqueous solution (refer to the scheme below). It was confirmed using silver nitrate that Bmim(Br) did not remain.

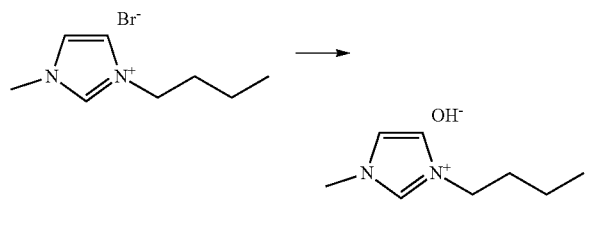

Synthesis of Salt Bvim(OH)

An aqueous solution of Bvim(OH) was obtained in the same manner as in the section of (Synthesis of hydroxide salt Bmim(OH)), except that, in the synthesis of the hydroxide salt Bmim(OH), 1-vinylimidazole was used instead of 1-methylimidazole.

Synthesis of Compound I-3

30 mg of Intermediate H powder was added to 1.98 g ($5.72 \times 10^{-5}$ mol/g) of a Bmim(OH) aqueous solution which was then stirred at room temperature for 12 hours. Thereafter, the solvent was distilled off from the obtained solution under reduced pressure, followed by vacuum drying under heating to obtain a compound I-3.

Synthesis of Compound I-4

A compound I-4 was obtained in the same manner as in the section of (Synthesis of compound I-3), except that, in the synthesis of the compound I-3, a Bvim(OH) aqueous solution was used instead of the Bmim(OH) aqueous solution.

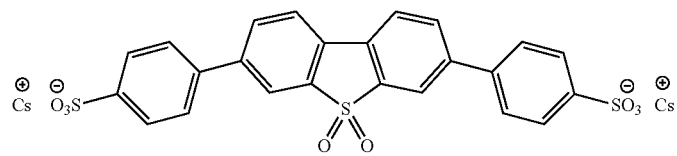
(II-1)

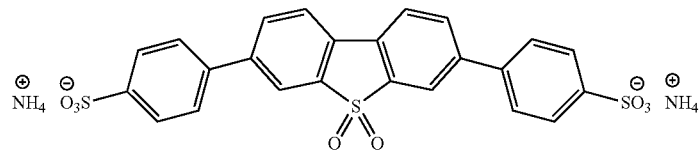
(II-2)

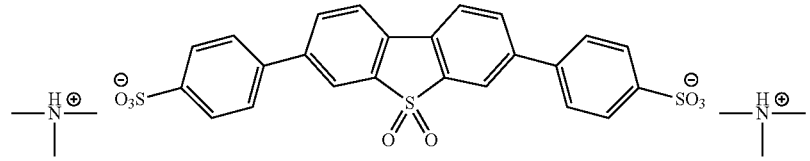
(II-3)

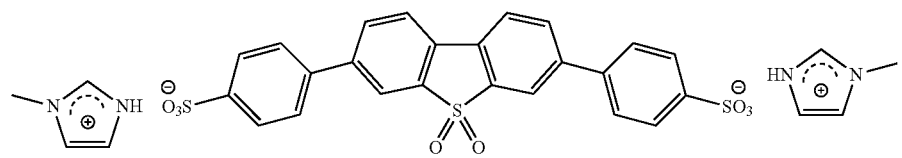
(II-4)

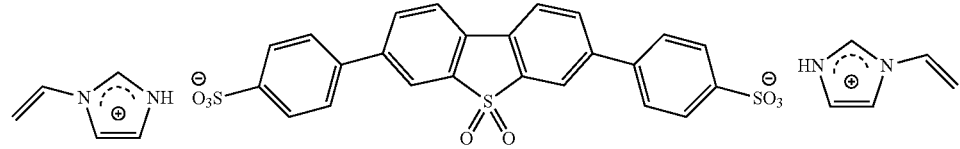
(II-5)

Example 1

A composition 1 for forming an optically anisotropic film having the following composition was prepared. The composition 1 for forming an optically anisotropic film was a composition exhibiting lyotropic liquid crystallinity.

| Composition 1 for forming optically anisotropic film | |
|---|---|
| Compound I-1 | 20 parts by mass |
| Water | 80 parts by mass |

The composition 1 for forming an optically anisotropic film prepared above was applied onto a glass substrate as a substrate with a wire bar (moving speed: 100 cm/s), and then air-dried to prepare an optically anisotropic film 1.

Examples 2 to 4

Optically anisotropic films 2 to 4 were prepared in the same manner as in Example 1, except that the compound was changed to the compound shown in Table 1 which will be given later.

Comparative Example 1

An optically anisotropic film C1 was prepared in the same manner as in Example 1, except that the compound was changed to the compound shown in Table 1 which will be given later.

Comparative Examples 2 to 5

In a case where an attempt was made to prepare an optically anisotropic film in the same manner as in Example 1, except that the compound was changed to the compound shown in Table 1 which will be given later, it was not possible to prepare an optically anisotropic film that could be subjected to various evaluations in a case where the composition for forming an optically anisotropic film was applied and then allowed to be air-dried.

The Re(550) of each of the optically anisotropic films produced in Examples 1 to 4 was 142±10 nm.

Evaluation

Evaluation of Liquid Crystallinity

The evaluation of liquid crystallinity was carried out by observing the composition for forming an optically anisotropic film prepared in each of Examples and Comparative Examples with a polarization microscope. The composition for forming an optically anisotropic film was added dropwise onto a slide glass and covered with a cover glass to obtain a prepared slide. "A" was assigned to the case where the texture peculiar to the liquid crystal phase could be confirmed under crossed nicols, and "B" was assigned to the case where the texture peculiar to the liquid crystal phase could not be confirmed under crossed nicols.

A composition for forming an optically anisotropic film having the same composition was prepared except that water, which is the solvent for the composition for forming an optically anisotropic film prepared in each of Examples and Comparative Examples, was replaced with a mixture of water and propylene glycol monomethyl ether (PGME) (water:PGME=90:10 (mass ratio)). Then, using the obtained composition for forming an optically anisotropic film, an evaluation was carried out according to the same procedure as described above, depending on whether or not the texture peculiar to the liquid crystal phase could be confirmed.

The results are shown in Table 1 which will be given later.

Evaluation of Moisture Resistance

For the evaluation of moisture resistance (moisture-heat durability), a test was carried out in which the optically anisotropic films prepared in Examples and Comparative Examples were allowed to stand for 500 hours in an environment of a temperature of 60° C. and a relative humidity of 90%. The Re(550) of the optically anisotropic films after the test was measured, and the moisture resistance was evaluated according to the following standards. The results are shown in Table 1 which will be given later.

A: A variation in Re(550) after the test with respect to the initial phase difference value is less than 10% of the initial value.

B: A variation in Re(550) after the test with respect to the initial phase difference value is 10% or more of the initial value.

Evaluation of Polymerizability

The liquid crystal compound (compound I-1) contained in the composition 1 for forming an optically anisotropic film of Example 1 and an initiator PI having the following structural formula in an amount of 1% by mass with respect to the total mass of the compound I-1 were mixed to prepare a polymerizable composition 1.

Polymerizable compositions 2 to 4 and C1 to C5 were prepared in the same manner as above, except that each of the compounds I-2 to I-4 or each of the compounds II-1 to II-5 was used instead of the compound I-1.

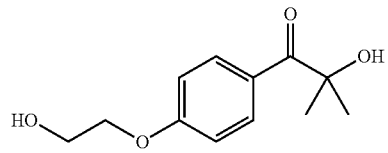 [SMILES: CC(C)(O)C(=O)c1ccc(OCCO)cc1]

Each of the obtained polymerizable compositions (polymerizable compositions 1 to 4 and C1 to C5) was bar-coated on a glass substrate, and the obtained film was subjected to a drying treatment. The obtained film was irradiated with ultraviolet light (500 mJ/cm$^2$). In the infrared spectrum measurement after the ultraviolet light irradiation, "A" was assigned to the case where the disappearance of the absorption peak derived from the double bond could be confirmed, and "B" was assigned to the case where there was no absorption peak derived from the double bond in the first place and the case where the disappearance of the absorption peak could not be confirmed.

The results are shown in Table 1 which will be given later.

In Table 1, the column of "Type of compound" represents the compound used.

In Table 1, the column of "Water" in the column of "Liquid crystallinity" shows the results of the liquid crystallinity evaluation in a case where water was used as the solvent, and the column of "Water/PGME" in the column of "Liquid crystallinity" shows the results of the liquid crystallinity evaluation in a case where a mixture of water and PGME was used as the solvent.

In Table 1, in the column of "Nz factor", the case where the Nz factor of the obtained optically anisotropic film is negative is represented as "Negative", and the case where the Nz factor of the obtained optically anisotropic film is positive is represented as "Positive". In addition, the numerical values in parentheses in the column of "Nz factor" represent the Nz factor for each Example.

As described above, an optically anisotropic film for carrying out various evaluations could not be formed in Comparative Examples 2 to 5, so items not evaluated are represented by "-".

TABLE 1

|  | Type of compound | Liquid crystallinity | | Moisture resistance | Polymerizability | Nz factor |
|---|---|---|---|---|---|---|
|  |  | Water | Water/PGME |  |  |  |
| Example 1 | Compound I-1 | A | A | A | B | Negative (−0.20) |
| Example 2 | Compound I-2 | A | A | A | B | Negative (−0.15) |
| Example 3 | Compound I-3 | A | A | A | B | Negative (−0.23) |
| Example 4 | Compound I-4 | A | A | A | A | Negative (−0.25) |
| Comparative Example 1 | Compound II-1 | A | B | B | B | Positive (0.35) |
| Comparative Example 2 | Compound II-2 | B | B | — | B | — |
| Comparative Example 3 | Compound II-3 | B | B | — | B | — |
| Comparative Example 4 | Compound II-4 | B | B | — | B | — |
| Comparative Example 5 | Compound II-5 | B | B | — | B | — |

As shown in Table 1, the optically anisotropic film formed of the composition according to the embodiment of the present invention exhibited a predetermined effect.

Each compound contained in the compositions of Comparative Examples 1 to 4 contains an organic cation or inorganic cation having a hydrogen atom bonded to a quaternary nitrogen atom as a counter ion. On the other hand, it is considered that the non-coloring lyotropic liquid crystal compound represented by Formula (X) contained in the composition according to the embodiment of the present invention contains a predetermined organic cation (an organic cation that has neither a hydrogen atom bonded to a quaternary nitrogen atom, a hydrogen atom bonded to a quaternary phosphorus atom, nor a hydrogen atom bonded to a tertiary sulfur atom) as a counterion, so the obtained optically anisotropic film has improved hydrophobicity due to the hydrophobicity possessed by the cation, resulting in improved moisture resistance. In addition, it has been confirmed that the non-coloring lyotropic liquid crystal compound represented by Formula (X) has increased hydrophobicity for the same reason, and thus exhibits liquid crystallinity even in a case where an organic solvent (propylene glycol monomethyl ether) is mixed in addition to water as the solvent for the composition for forming an optically anisotropic film. This is considered to be advantageous from the viewpoint of efficiently preparing an optically anisotropic film and from the viewpoint of maintaining stable liquid crystallinity even in harsh environments such as high temperature and high humidity.

It has been confirmed that the non-coloring lyotropic liquid crystal compound represented by Formula (X) contained in the composition of Example 4 contains an organic cation having a polymerizable group, so that it is possible to immobilize the liquid crystal alignment.

EXPLANATION OF REFERENCES

10: support
12: specific compound

What is claimed is:
1. A composition comprising:
a non-coloring lyotropic liquid crystal compound represented by Formula (X),

$$(R_{x1}\text{-}(L_{x1}\text{-}L_{x2}\text{-}R_{x2})_n)^{a-}(M^{b+})_c \qquad \text{Formula (X)}$$

$R_{x1}$ represents an n-valent monocyclic group, an n-valent fused polycyclic group, or a residue obtained by removing n hydrogen atoms from a compound represented by Formula (Y1),

$$R_{y1}\text{—}R_{y2} \qquad \text{Formula (Y1)}$$

$R_{y1}$ and $R_{y2}$ each independently represent a monovalent fused polycyclic group, $L_{x1}$ represents a single bond, a divalent aromatic ring group, or a group represented by Formula (Y2), provided that, in a case where $R_{x1}$ is an n-valent monocyclic group, at least one of n $L_{x1}$'s represents a divalent aromatic ring group or a group represented by Formula (Y2), in a case where n is 2 or more, a plurality of $L_{x1}$'s may be the same or different from each other,

$$*\text{—}R_{y3}\text{—}(R_{y4})_m\text{—}* \qquad \text{Formula (Y2)}$$

$R_{y3}$ and $R_{y4}$ each independently represent a divalent aromatic ring group, in a case where m is 2, the two $R_{y4}$'s may be the same or different from each other, m represents 1 or 2,

* represents a bonding position, $L_{x2}$ represents a single bond, —O—, —S—, —CO—, —NR$_{x4}$—, —SO—, —SO$_2$—, an alkylene group, an alkenylene group, an alkynylene group, or a group formed by a combination thereof, $R_{x4}$ represents a hydrogen atom or an alkyl group, in a case where n is 2 or more, a plurality of $L_{x2}$'s may be the same or different from each other, $R_{x2}$ represents an anionic group, in a case where n is 2 or more, a plurality of $R_{x2}$'s may be the same or different from each other, n represents an integer of 1 to 4, $M^{b+}$ represents a b-valent organic cation that has neither a hydrogen atom bonded to a quaternary nitrogen atom, a hydrogen atom bonded to a quaternary phosphorus atom, nor a hydrogen atom bonded to a tertiary sulfur atom, in a case where c is 2 or more, a plurality of $M^{b+}$'s may be the same or different from each other, a to c each independently represent an integer of 1 or more and satisfy a relationship of Expression (1), and $$a = b \times c \qquad \text{Expression (1)}$$

a is an integer of 1 to 4, b is 1 or 2, c is an integer of 1 to 4, a and n satisfy a relationship of Expression (2), Expression (2) a=total of valences of the anionic groups represented by n $R_{x2}$'s.

2. The composition according to claim 1, wherein $M^{b+}$ represents any of organic cations represented by Formula (W1) to Formula (W8),

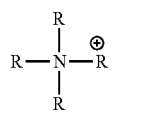 (W1)

 (W2)

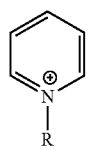 (W3)

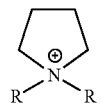 (W4)

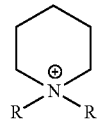 (W5)

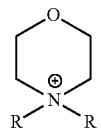 (W6)

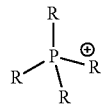 (W7)

 (W8)

R's each independently represent a substituent, and the substituent contains neither a hydrogen atom bonded to a quaternary nitrogen atom, a hydrogen atom bonded to a quaternary phosphorus atom, nor a hydrogen atom bonded to a tertiary sulfur atom.

3. The composition according to claim 1, wherein the anionic group is $-SO_3^-$ or $-COO^-$.

4. The composition according to claim 1, wherein n is 2, a is 2, b is 1, and c is 2, $R_{x1}$ represents a 2-valent monocyclic group, a 2-valent fused polycyclic group, or a residue obtained by removing 2 hydrogen atoms from the compound represented by Formula (Y1).

5. The composition according to claim 4, wherein $R_{x1}$ is a divalent fused polycyclic group.

6. An optically anisotropic film formed of the composition according to claim 1.

7. A circularly polarizing plate comprising:
the optically anisotropic film according to claim 6; and
a polarizer.

8. The circularly polarizing plate according to claim 7, wherein an angle formed by an in-plane slow axis of the optically anisotropic film and an absorption axis of the polarizer is in a range of 45°±5°.

9. A display device comprising:
the circularly polarizing plate according to claim 7; and
a display element.

10. The display device according to claim 9, wherein the display element is an organic electroluminescent display element.

11. A non-coloring lyotropic liquid crystal compound represented by Formula (X)

$$(R_{x1}\text{-}(L_{x1}\text{-}L_{x2}\text{-}R_{x2})_n)^{a-}(M^{b+})_c \qquad \text{Formula (X)}$$

$R_{x1}$ represents an n-valent monocyclic group, an n-valent fused polycyclic group, or a residue obtained by removing n hydrogen atoms from a compound represented by Formula (Y1), $$R_{y1}\text{—}R_{y2} \qquad \text{Formula (Y1)}$$

$R_{y1}$ and $R_{y2}$ each independently represent a monovalent fused polycyclic group, $L_{x1}$ represents a single bond, a divalent aromatic ring group, or a group represented by Formula (Y2), provided that, in a case where $R_{x1}$ is an n-valent monocyclic group, at least one of n $L_{x1}$'s represents a divalent aromatic ring group or a group represented by Formula (Y2), in a case where n is 2 or more, a plurality of $L_{x1}$'s may be the same or different from each other, $$*\text{—}R_{y3}\text{—}(R_{y4})_m\text{—} \qquad \text{Formula (Y2)}$$

$R_{y3}$ and $R_{y4}$ each independently represent a divalent aromatic ring group, in a case where m is 2, the two $R_{y4}$'s may be the same or different from each other, m represents 1 or 2,

* represents a bonding position, $L_{x2}$ represents a single bond, $-O-$, $-S-$, $-CO-$, $-NR_{x4}-$, $-SO-$, $-SO_2-$, an alkylene group, an alkenylene group, an alkynylene group, or a group formed by a combination thereof, $R_{x4}$ represents a hydrogen atom or an alkyl group, in a case where n is 2 or more, a plurality of $L_{x2}$'s may be the same or different from each other, $R_{x2}$ represents an anionic group, in a case where n is 2 or more, a plurality of $R_{x2}$'s may be the same or different from each other, n represents an integer of 1 to 4, $M^{b+}$ represents a b-valent organic cation that has neither a hydrogen atom bonded to a quaternary nitrogen atom, a hydrogen atom bonded to a quaternary phosphorus atom, nor a hydrogen atom bonded to a tertiary sulfur atom, a to c each independently represent an integer of 1 or more and satisfy the relationship of Expression (1), and $$a = b \times c \qquad \text{Expression (1)}$$

a is an integer of 1 to 4,
b is 1 or 2,
c is an integer of 1 to 4,
a and n satisfy a relationship of Expression (2),
Expression (2) a=total of valences of the anionic groups represented by n $R_{x2}$'s.

12. The compound according to claim 11,
wherein $M^{b+}$ represents any of organic cations represented by Formula (W1) to Formula (W8),

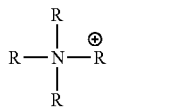 (W1)

 (W2)

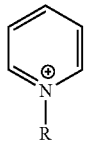 (W3)

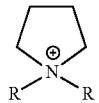 (W4)

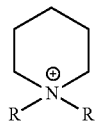 (W5)

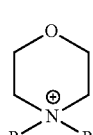 (W6)

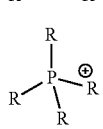 (W7)

 (W8)

R's each independently represent a substituent, and the substituent contains neither a hydrogen atom bonded to a quaternary nitrogen atom, a hydrogen atom bonded to a quaternary phosphorus atom, nor a hydrogen atom bonded to a tertiary sulfur atom.

13. The compound according to claim 11,
wherein the anionic group is —$SO_3^-$ or —$COO^-$.

14. The compound according to claim 11,
wherein n is 2, a is 2, b is 1, and c is 2,
$R_{x1}$ represents a 2-valent monocyclic group, a 2-valent fused polycyclic group, or a residue obtained by removing 2 hydrogen atoms from the compound represented by Formula (Y1).

15. The compound according to claim 14,
wherein $R_{x1}$ is a divalent fused polycyclic group.

16. A method for producing the compound according to claim 11, the method comprising:
a step of mixing a compound represented by Formula (Z1) with a compound represented by Formula (Z2), $$R_{x1}\text{-}(L_{x1}\text{-}L_{x2}\text{-}R_{x3})_n \qquad \text{Formula (Z1)}$$

$$(M^{b+})_d(OH^-)_e \qquad \text{Formula (Z2)}$$

$R_{x1}$ represents an n-valent monocyclic group, an n-valent fused polycyclic group, or a residue obtained by removing n hydrogen atoms from a compound represented by Formula (Y1), $$R_{y1}\text{—}R_{y2} \qquad \text{Formula (Y1)}$$

$R_{y1}$ and $R_{y2}$ each independently represent a monovalent fused polycyclic group,
$L_{x1}$ represents a single bond, a divalent aromatic ring group, or a group represented by Formula (Y2), provided that, in a case where $R_{x1}$ is an n-valent monocyclic group, at least one of n $L_{x1}$'s represents a divalent aromatic ring group or a group represented by Formula (Y2), in a case where n is 2 or more, a plurality of $L_{x1}$'s may be the same or different from each other, $$*\text{—}R_{y3}\text{—}(R_{y4})_m\text{—} \qquad \text{Formula (Y2)}$$

$R_{y3}$ and $R_{y4}$ each independently represent a divalent aromatic ring group, in a case where m is 2, the two $R_{y4}$'s may be the same or different from each other,
m represents 1 or 2,
* represents a bonding position,
$L_{x2}$ represents a single bond, —O—, —S—, —CO—, —$NR_{x4}$—, —SO—, —$SO_2$—, an alkylene group, an alkenylene group, an alkynylene group, or a group formed by a combination thereof, $R_{x4}$ represents a hydrogen atom or an alkyl group, in a case where n is 2 or more, a plurality of $L_{x2}$'s may be the same or different from each other,
$R_{x3}$ represents an acid group, in a case where n is 2 or more, a plurality of $R_{x3}$'s may be the same or different from each other,
n represents an integer of 1 or more to 4,
$M^{b+}$ represents a b-valent organic cation that has neither a hydrogen atom bonded to a quaternary nitrogen atom, a hydrogen atom bonded to a quaternary phosphorus atom, nor a hydrogen atom bonded to a tertiary sulfur atom, and
b is 1 or 2,
d is 1 or 2,
e is an integer of 1 to 4, and b, d, and e satisfy a relationship of Expression (3), $$e = b \times d \qquad \text{Expression (3).}$$

17. The composition according to claim 2,
wherein the anionic group is —$SO_3^-$ or —$COO^-$.

18. The composition according to claim 2,
wherein n is 2, a is 2, b is 1, and c is 2,
$R_{x1}$ represents a 2-valent monocyclic group, a 2-valent fused polycyclic group, or a residue obtained by removing 2 hydrogen atoms from the compound represented by Formula (Y1).

19. The composition according to claim 18, wherein $R_{x1}$ is a divalent fused polycyclic group.

20. An optically anisotropic film formed of the composition according to claim 2.

* * * * *